US012132108B2

(12) United States Patent
Su et al.

(10) Patent No.: US 12,132,108 B2
(45) Date of Patent: Oct. 29, 2024

(54) DUAL GATE STRUCTURES FOR SEMICONDUCTOR DEVICES

(71) Applicant: Taiwan Semiconductor Manufacturing Co., Ltd., Hsinchu (TW)

(72) Inventors: Po-Chih Su, New Taipei (TW); Ruey-Hsin Liu, Hsin-Chu (TW); Pei-Lun Wang, Hsinchu County (TW); Jia-Rui Lee, Kaohsiung (TW); Jyun-Guan Jhou, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/876,795

(22) Filed: Jul. 29, 2022

(65) Prior Publication Data

US 2022/0384647 A1    Dec. 1, 2022

Related U.S. Application Data

(62) Division of application No. 17/141,462, filed on Jan. 5, 2021, now Pat. No. 11,894,459.

(Continued)

(51) Int. Cl.
*H01L 29/78* (2006.01)
*H01L 29/40* (2006.01)
(Continued)

(52) U.S. Cl.
CPC ........ *H01L 29/7835* (2013.01); *H01L 29/401* (2013.01); *H01L 29/402* (2013.01);
(Continued)

(58) Field of Classification Search
CPC ......... H01L 29/66659; H01L 29/66484; H01L 29/7835; H01L 29/7831; H01L 29/66553;
(Continued)

(56) References Cited

U.S. PATENT DOCUMENTS 9,224,858 B1    12/2015  Camillo-Castillo et al.
10,026,819 B2   7/2018   Kim
(Continued)

FOREIGN PATENT DOCUMENTS

KR    20090066676 A    6/2009
KR    20180006184 A    1/2018
WO    WO 2012/066695 A1  5/2012

OTHER PUBLICATIONS

Extended European Search Report for European Patent Appl. No. 21186931.8, 7 pages, dated Dec. 7, 2021.
(Continued)

*Primary Examiner* — Yu Chen
(74) *Attorney, Agent, or Firm* — Sterne, Kessler, Goldstein & Fox P.L.L.C.

(57) ABSTRACT

The present disclosure describes a semiconductor structure that includes a channel region, a source region adjacent to the channel region, a drain region, a drift region adjacent to the drain region, and a dual gate structure. The dual gate structure includes a first gate structure over portions of the channel region and portions of the drift region. The dual gate structure also includes a second gate structure over the drift region.

20 Claims, 16 Drawing Sheets

Related U.S. Application Data

(60) Provisional application No. 63/055,779, filed on Jul. 23, 2020.

(51) Int. Cl.
*H01L 29/49* (2006.01)
*H01L 29/66* (2006.01)

(52) U.S. Cl.
CPC ...... *H01L 29/4916* (2013.01); *H01L 29/4966* (2013.01); *H01L 29/4991* (2013.01); *H01L 29/66484* (2013.01); *H01L 29/66545* (2013.01); *H01L 29/66553* (2013.01); *H01L 29/66659* (2013.01); *H01L 29/7831* (2013.01)

(58) Field of Classification Search
CPC . H01L 29/66545; H01L 29/4916–4941; H01L 29/4966–4975; H01L 29/4991; H01L 29/515; H01L 29/0649; H01L 29/402–407; H01L 29/66681; H01L 29/7816; H01L 29/6656; H01L 21/28132; H01L 21/28141
See application file for complete search history.

(56) References Cited

U.S. PATENT DOCUMENTS

| | | |
|---|---|---|
| 2006/0065928 A1 | 3/2006 | Nagai |
| 2010/0102363 A1 | 4/2010 | Hause et al. |
| 2011/0193161 A1 | 8/2011 | Zhu et al. |
| 2011/0241113 A1 | 10/2011 | Zuniga |
| 2012/0161230 A1 | 6/2012 | Satoh et al. |
| 2012/0168869 A1 | 7/2012 | Hikida |
| 2012/0228695 A1 | 9/2012 | Toh et al. |
| 2013/0341715 A1 | 12/2013 | McGregor |
| 2014/0264580 A1 | 9/2014 | Meiser et al. |
| 2015/0123199 A1 | 5/2015 | Chen et al. |
| 2016/0247913 A1 | 8/2016 | Wang et al. |
| 2017/0084736 A1 | 3/2017 | Toh et al. |
| 2017/0125252 A1 | 5/2017 | Strachan et al. |
| 2018/0006184 A1 | 1/2018 | Blaszczack et al. |
| 2018/0012970 A1* | 1/2018 | Kim ............... H01L 29/4238 |
| 2018/0277677 A1 | 9/2018 | Lin et al. |
| 2019/0027585 A1 | 1/2019 | Wei et al. |
| 2020/0402812 A1 | 12/2020 | Kalnitsky et al. |
| 2021/0272811 A1 | 9/2021 | Ji et al. |
| 2022/0005950 A1 | 1/2022 | Shafi et al. |
| 2022/0029020 A1 | 1/2022 | Su et al. |

OTHER PUBLICATIONS

Pocha et al., "Threshold voltage controllability in double-diffused-MOS transistors," IEEE Transactions on Electron Devices, Dec. 1974, vol. 21, No. 12, pp. 778-784.

* cited by examiner

DUAL GATE STRUCTURES FOR SEMICONDUCTOR DEVICES

CROSS-REFERENCE TO RELATED APPLICATIONS

This application is a divisional of U.S. patent application Ser. No. 17/141,462, titled "Dual Gate Structures for Semiconductor Devices," filed on Jan. 5, 2021, which claims the benefit of U.S. Provisional Patent Application No. 63/055,779, titled "Dual Gate Structures for Semiconductor Devices," filed Jul. 23, 2020, each of which is incorporated herein by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices. Fin-type field effect transistors (finFETs) have been developed to reduce device footprint and improve device performance. FinFETs are FETs formed over a fin that is vertically oriented with respect to a planar surface of a wafer.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
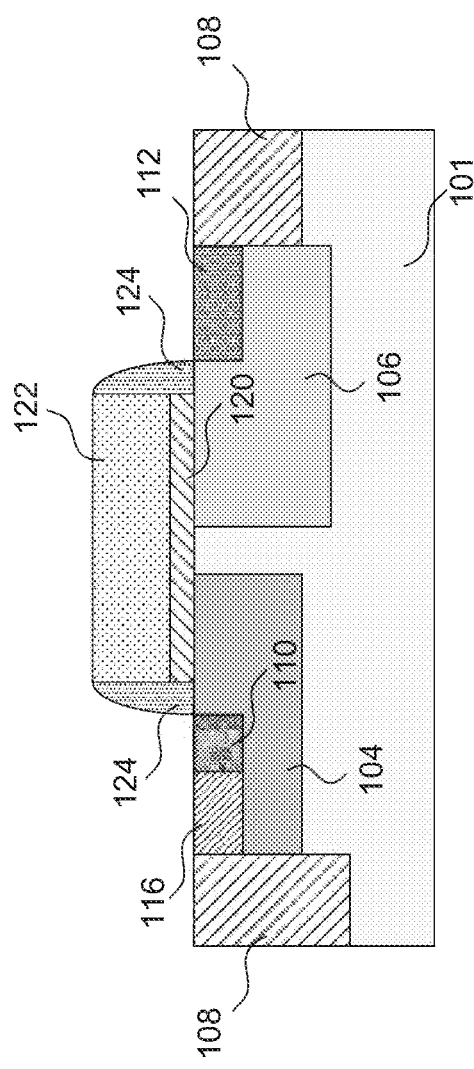
FIG. 1 is an isometric view of a semiconductor structure, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The present disclosure provides methods for forming metal-oxide-semiconductor FET (MOSFET) devices incorporating dual gate structures. The present disclosure can be applied to suitable semiconductor structures, such as planar FET and fin-type FET (finFET) devices. The term "finFET" refers to a FET formed over a fin that is vertically oriented with respect to a planar surface of a wafer. The term "vertical," as used herein, refers to nominally perpendicular to the surface of a substrate. The methods can also be applied towards forming any suitable semiconductor structures, such as horizontal and vertical gate-all-around FETs (GAAFETs). In some embodiments, the present disclosure can be applied to any suitable technology nodes, such as a 65 nm technology node, a 55 nm technology node, a 40 nm technology node, and other suitable technology nodes.

The performance and scalability of silicon-based transistors is reaching fundamental limits despite the implementation of various enhancement techniques, such as novel device architectures for enhanced electrostatic control, transport enhancement by strained channels and improved dopant activation. As device dimensions are scaled down to achieve higher packing density, it has been a challenge to shrink silicon-based transistors. Various devices have been developed to reduce device footprint and improve device performance. For example, metal-oxide-semiconductor FETs (MOSFETs) and finFETs are developed. In MOSFET and finFET devices, a gate terminal is placed above a channel region and between source and drain terminals for switching the devices between ON and OFF states. Increasing the gate length can improve control of the channel region, preventing source/drain punch through, and improve device robustness and reliability. However, increasing the gate length can also lead to high parasitic gate capacitance and poor performance in high frequency applications. For example, higher parasitic gate capacitance can lead to longer charging/discharging time which can cause longer ON/OFF switching times.

Various embodiments in the present disclosure describe methods for forming semiconductor transistor devices with dual gate structures formed between source/drain regions. A first gate structure can be formed above a channel region for controlling the ON/OFF status of the transistor device. A second gate structure can be formed above a drift region that is located between the channel region and the drain region. The second gate structure can be electrically decoupled from the first gate structure. During device operation, the first and second gate structures can be biased at different voltage levels. Compared to a single gate structure, the dual gate structure can provide the benefits of, among other things, (i) reduction in parasitic capacitance which in turn can reduce gate charge while switching between ON and OFF states; (ii) self-aligned source/drain formation without adding additional fabrication steps; and (iii) no additional masking layers required. In some embodiments, implementing a dual gate structure formed in place of a single gate structure can achieve about 20% to about 50% reduction in parasitic capacitance.

FIG. 1 is an isometric view of a semiconductor structure 100, in accordance with some embodiments of the present disclosure. Semiconductor structure 100 includes a single gate structure formed on substrate 101. In some embodiments, semiconductor structure 100 includes planar semiconductor devices. Additional structures, such as source/drain contacts, work function layers, etch stop layers, and any suitable structures, can be included in semiconductor structure 100 and are not illustrated in FIG. 11 for simplicity.

Substrate 101 of FIG. 1 can be a silicon substrate, according to some embodiments. In some embodiments, substrate 101 can be (i) another semiconductor, such as germanium; (ii) a compound semiconductor including silicon carbide, gallium arsenide, gallium phosphide, indium phosphide, indium arsenide, gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), and/or indium antimonide; (iii) an alloy semiconductor including SiGe; or (iv) combinations thereof. In some embodiments, substrate 101 can be a silicon on insulator (SOI). In some embodiments, substrate 101 can be an epitaxial material.

Channel region 104 can be formed in substrate 101 using suitable implantation processes. A patterned masking layer (e.g., photoresist material) can be formed on substrate 101 and an ion implantation process can be used to dope regions of substrate 101 exposed by the patterned masking layer. In some embodiments, channel region 104 can be doped with p-type dopants. For example, a p-type dopant implanted via the ion implantation process into substrate 101 can include boron, aluminum, gallium, indium, or other p-type acceptor material. In some embodiments, an n-type dopant can be implanted to form channel region 101. For example, n-type dopants—such as arsenic, phosphorous, and antimony—can be used.

Drift region 106 can be formed adjacent to channel region 104. In some embodiments, drift region 106 can be a low doping concentration region between channel region 104 and drain region 112. In some embodiments, drift region 106 and channel region 104 can be doped using the same dopant type. For example, channel region 104 and drift region 106 can be doped with n-type or p-type dopants. In some embodiments, channel region 104 and drift region 106 can be doped using different types of dopants (e.g., doped with both n-type and p-type dopants).

Isolation structures 108 can a dielectric material, such as silicon oxide, spin-on-glass, silicon nitride, silicon oxynitride, fluorine-doped silicate glass (FSG), a low-k dielectric material, other suitable insulating material, and combinations thereof. In some embodiments, isolation structures 108 can be shallow trench isolation (STI) structures and can be formed by etching trenches in substrate 101. The trenches can be filled with insulating material, followed by a chemical-mechanical polishing (CMP) and etch-back process. Other fabrication techniques for isolation structures 108 are possible. Isolation structures 108 can include a multi-layer structure, such as a structure with one or more liner layers. Isolation structures 108 can also be formed by depositing an enhanced gap fill layer using the multi-step deposition and treatment process to eliminate voids and seams in the gap fill material.

Source region 110 and drain region 112 can be formed using a self-aligned ion implantation process. In some embodiments, a dopant concentration of drift region 106 can be lower than a dopant concentration of channel region 104 or drain region 112. Bulk region 116 can also be formed in channel region 104 and abutting source region 112. In some embodiments, bulk region 110 can be formed of an intrinsic material or a semiconductor material doped with p-type or n-type dopants.

A gate structure can be formed on substrate 101 and above channel region 104 and drift region 106. The gate structure can include a gate dielectric layer 120, and a gate electrode 122, according to some embodiments. The gate structure can include additional structures, such as work function layers, barrier layers, other suitable structures, and are not illustrated in FIG. 1 for simplicity. Gate dielectric layer 120 can be formed using a high-k material (e.g., a dielectric material having dielectric constant greater than about 3.9). In some embodiments, the gate structure uses polysilicon as gate electrode 122. Although the gate structure can use polysilicon or amorphous silicon for gate electrode 122, the gate structure can be a sacrificial gate structure, such as a gate structure formed in a replacement gate process for a metal gate structure. Spacers 124 can be formed on sidewalk of gate dielectric layer 120 and gate electrode 122. In some embodiments, spacers 124 can be formed using dielectric material, such as silicon oxide, silicon nitride, any suitable dielectric material, or combinations thereof.

Semiconductor device structure 100 can include additional processing to form various features, such as lightly-doped-drain (LDD) regions and contact structures. The term "LDD region" is used to describe lightly-doped regions disposed between a channel region of a transistor and at least one of the transistor's source/drain regions. LDD regions can be formed by doping, such as an ion implantation process.

Figure 2:
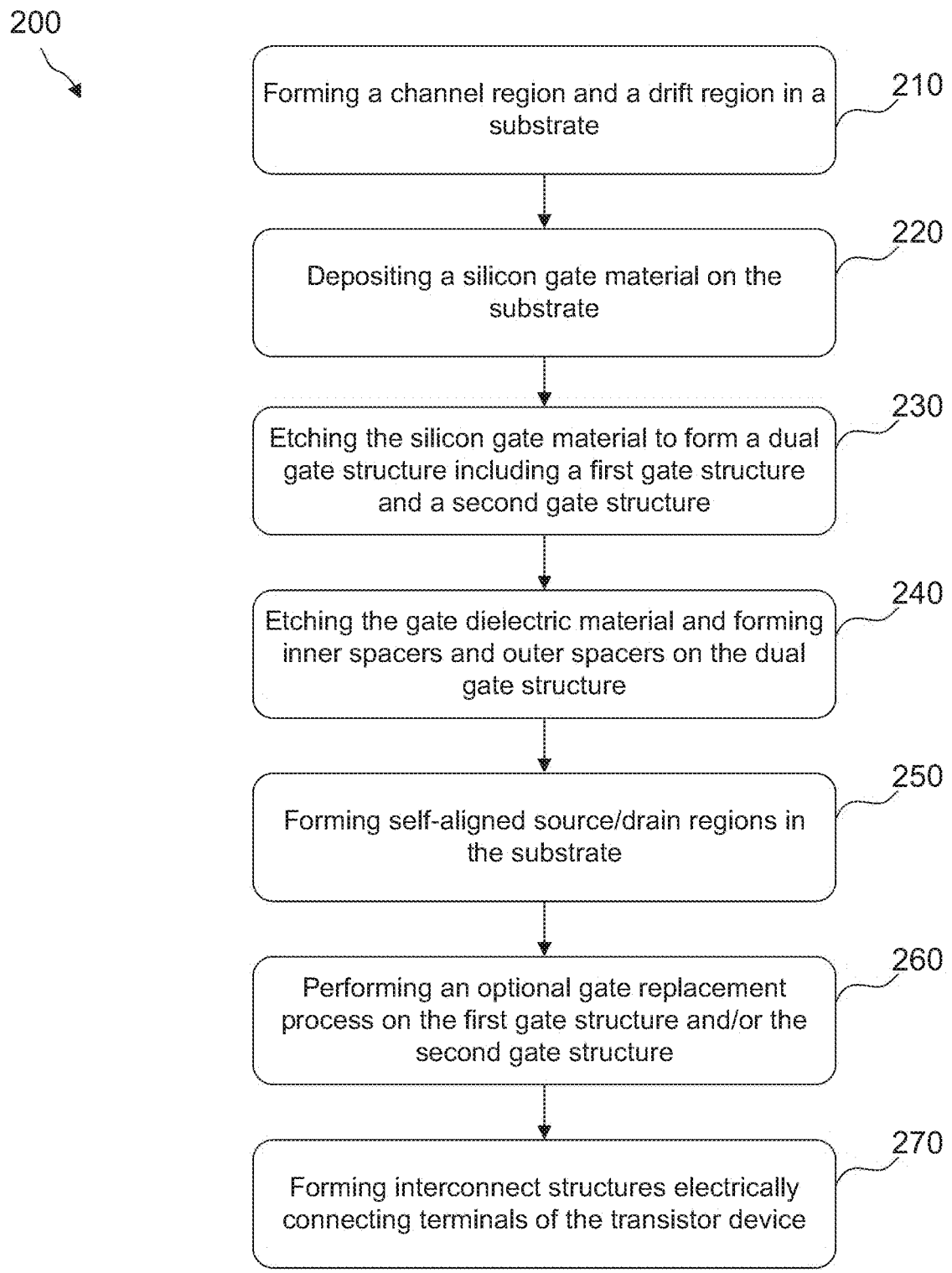
FIG. 2 is a flow diagram illustrating a method for forming semiconductor devices having dual gate structures, in accordance with some embodiments.

FIG. 2 is a flow diagram of a method 200 for forming semiconductor devices with dual gate structures, according to some embodiments. For illustrative purposes, the operations illustrated in FIG. 2 will be described with reference to the example fabrication process illustrated in FIGS. 3-16. Operations can be performed in a different order or not performed depending on specific applications. Method 200 may not produce a complete semiconductor device. Accordingly, additional processes can be provided before, during, and after method 200, and that some other processes may only be briefly described herein.

Figure 3:
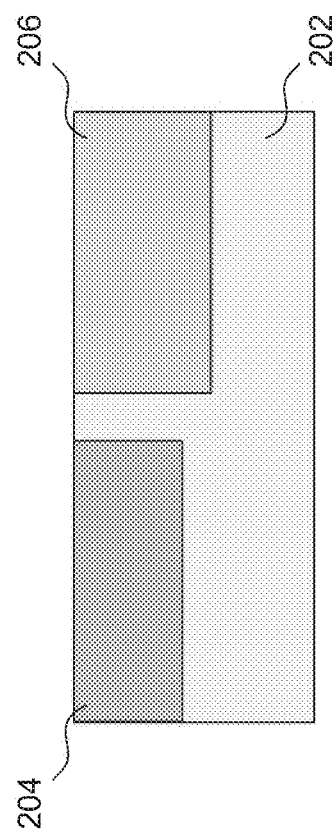
FIGS. 3-16 are cross-sectional views of various semiconductor devices, in accordance with some embodiments.
Figure 3:
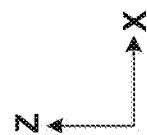

Referring to FIG. 2, in operation 210, channel regions and drift regions are formed on a substrate, according to some embodiments. As shown in FIG. 3, channel region 204 and drift region 206 are formed in substrate 202. In some embodiments, substrate 202 can be a wafer and formed using suitable materials, such as an elementary semiconductor, a compound semiconductor, an alloy semiconductor, and any suitable materials. In some embodiments, substrate 202 can be similar to substrate 101 illustrated in FIG. 1.

Channel region 204 can be formed in substrate 202 using suitable implantation processes. A patterned masking layer (e.g., photoresist material) can be formed on substrate 202 and an ion implantation process can be used to dope regions of substrate 202 exposed by the patterned masking layer. In some embodiments, channel region 204 can be doped with p-type departs. For example, a p-type dopant implanted via the ion implantation process into substrate 202 can include boron, aluminum, gallium, indium, or other p-type acceptor material. In some embodiments, an n-type dopant can be implanted to form channel region 204. For example, n-type dopants—such as arsenic, phosphorous, and antimony—can be used.

Drift region 206 can be formed adjacent to channel region 204. In some embodiments, drift region 206 can be a low doping concentration region between channel region 204 and the later formed drain region. Drift region can be used to provide a high device breakdown voltage and prevent hot-carrier injection (HCI). In some embodiments, drift region 206 can be doped using the same dopant type as channel region 204. For example, channel region 204 and drift region 206 can be both doped with n-type or p-type dopants. In some embodiments, channel region 204 and drift region 206 can be doped using different types of dopants. In some embodiments, a dopant concentration of drift region 206 can be lower than a dopant concentration of channel region 204 or the later formed drain region.

Figure 4:
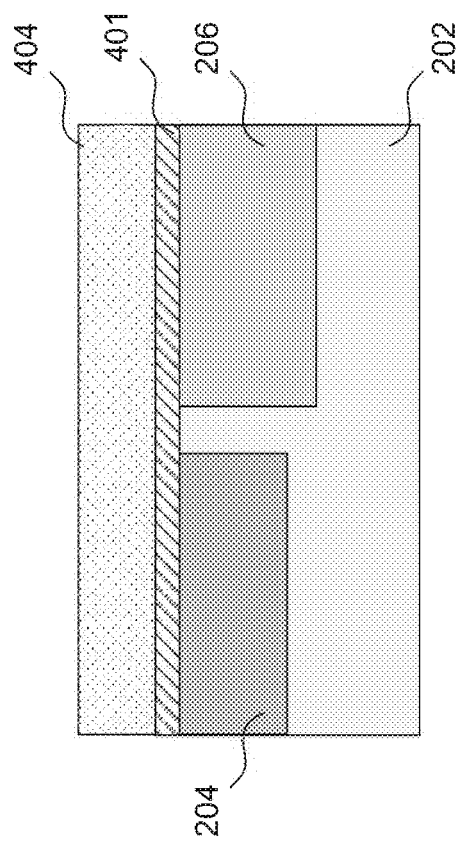

Referring to FIG. 2, in operation 220, a silicon gate material is deposited on a substrate, according to some embodiments. In some embodiments, a gate dielectric material can be deposited on the substrate prior to the formation of silicon gate material. As shown in FIG. 4, gate dielectric material 401 can be deposited on substrate 202, channel region 204, and drift region 206. Silicon gate material 404 can be formed on gate dielectric material 401.

Gate dielectric material 401 can be formed using a high-k dielectric material (e.g., materials having a dielectric constant greater than about 3.9). Gate dielectric material 401 can include (i) a layer of silicon oxide, silicon nitride, and/or silicon oxynitride; (ii) a high-k dielectric material, such as hafnium oxide ($HfO_2$), titanium oxide ($TiO_2$), tantalum oxide ($Ta_2O_3$), hafnium silicate ($HfSiO_4$), zirconium oxide ($ZrO_2$), and zirconium silicate ($ZrSiO_2$); (iii) a high-k dielectric material having oxides of lithium (Li), beryllium (Be), magnesium (Mg), praseodymium (Pr), neodymium (Nd), samarium (Sm), europium (Eu), Gd, terbium (Tb), Dy, holmium (Ho), thulium (Tm), ytterbium (Yb), lutetium (Lu); or (v) a combination thereof. Gate dielectric material 401 can be formed by chemical vapor deposition (CVD), atomic layer deposition (ALD), physical vapor deposition (PVD), sputtering, e-beam evaporation, or any other suitable deposition process.

Silicon gate material 404 can be deposited on a top surface of gate dielectric material 401. In some embodiments, silicon gate material 404 can be formed using polycrystalline silicone, single crystalline silicon, or any suitable material. In some embodiments, silicon gate material 404 can be formed using amorphous silicon material. Silicon gate material 404 can be deposited using CVD, PVD, sputtering, e-beam evaporation, any suitable deposition methods, and/or combinations thereof. In some embodiments, silicon gate material 404 can be formed using a material similar to that of substrate 101 in FIG. 1.

Figure 5:
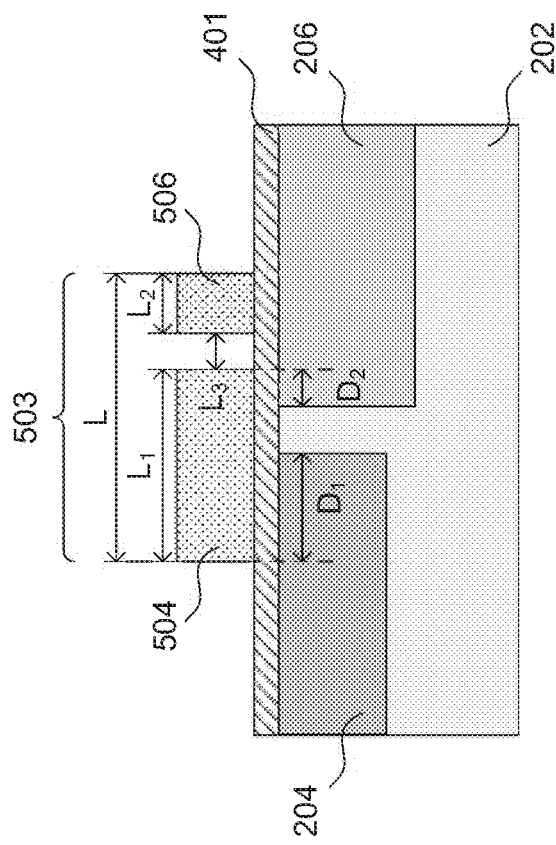

Referring to FIG. 2, in operation 230, the silicon gate material is etched to form a dual gate structure including a first gate structure and a second gate structure, according to some embodiments. As shown in FIG. 5, a dual gate structure 501 including first gate structure 504 and second gate structure 506 are formed on gate dielectric material 401 after a patterning process. In some embodiments, the patterning process can include forming a photoresist layer over silicon gate material 404, exposing the photoresist to a pattern, performing post-exposure bake processes, and developing the resist to form a masking element including the resist. The masking element can then be used to protect regions of silicon gate material 404 while one or more etching process can be used to remove the exposed portions of silicon gate material 404 until the underlying gate dielectric material 401 is exposed. The masking element can be removed using suitable removal processes (e.g., etching processes) after the dual gate structure is formed. In some embodiments, a total gate length L of dual gate structure measuring between outer sidewalls of first and second gate structures 504 and 506 can be between about 0.1 μm and about 3.5 μm. For example, the total gate length L can be between about 0.1 μm and about 1 μm, between about 1 μm and about 2 μm, between about 2 μm and about 3.5 μm, or any suitable dimension. In some embodiments, first gate structure 504 can have a first gate length $L_1$ between about 0.1 μm and about 2 μm. In some embodiments, second gate structure 506 can have a second gate length $L_2$ between about 0.02 μm and about 1 μm. In some embodiments, a ratio A of second gate length $L_2$ over first gate length $L_1$ can be between about 0.1 and about 0.6. A ratio A that is below 0.1 can result in second gate structure having a minimal impact on device operation due to its short gate length. A ratio A that is above 0.6 can result in larger device dimension which may result in reduced device density. In some embodiments, second gate length $L_2$ can be greater than gate length $L_1$. In some embodiments, a separation $L_3$ between first and second gate structures 504 and 506 can be between about 50 nm and about 200 nm. Having separation $L_3$ below about 50 nm can result in high gate-to-gate capacitance and lead to undesirable interference between gates. On the other hand, having separation $L_3$ greater than about 200 nm can result in larger device dimension. First gate structure 504 can overlap portions of both channel region 204 and drift region 206. In some embodiments, first gate structure 504 can overlap channel region 204 by a distance $D_1$ that is between about 0.1 μm and about 0.3 μm. In some embodiments, a ratio B of distance $D_1$ over first gate length $L_1$ can be between about 0.2 and about 0.9. For example, ratio B can be between about 0.2 and about 0.4, between about 0.4 and about 0.6, between about 0.6 and about 0.9, or any suitable ratio values. In some embodiments, first gate 504 can overlap drift region 206 by a distance $D_2$ that is between about 0.05 μm and about 0.3 μm. A ratio C of distance $D_2$ over first gate length $L_1$ can be between about 0.2 and 0.6. In some embodiments, ratio C can be between about 0.2 and about 0.3, between about 0.3 and about 0.4, between about 0.4 and about 0.5, between about 0.5 and about 0.6, or any suitable ratio values. Ratios B and C can be selected based on desired device functionality, such as threshold voltage, off current, on current, and other suitable functionalities. In some embodiments, second gate structure 506 can be formed entirely or partially above drift region 206.

Figure 6:
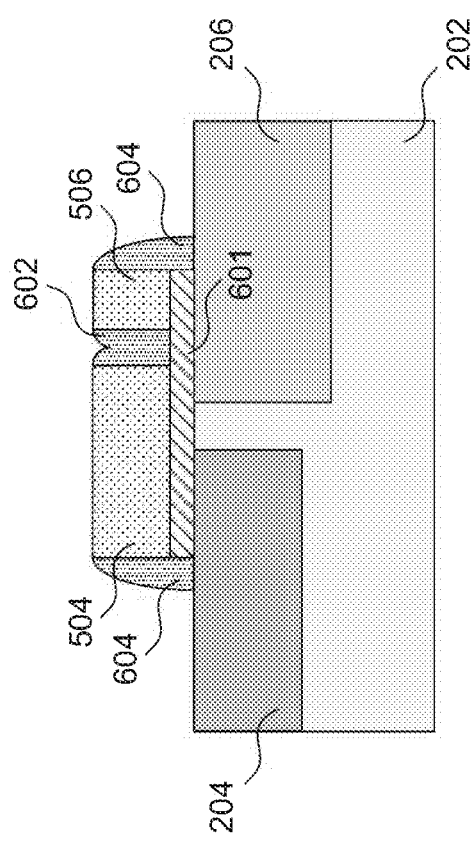
Figure 7:
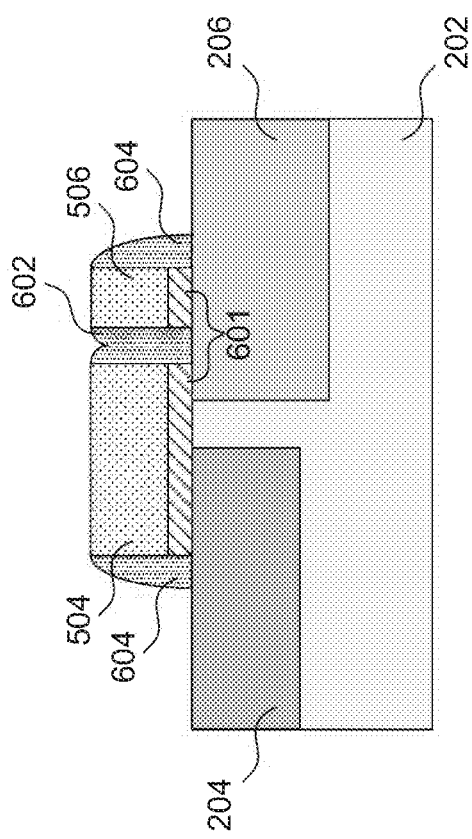
Figure 7:
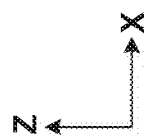

Referring to FIG. 2, in operation 240, gate dielectric material is etched and spacers are deposited on the dual gate structure, according to some embodiments. As shown in FIG. 6, gate dielectric material 401 is etched to form gate dielectric layer 601. One or more etching processes can be used to remove portions of gate dielectric material 401 to form gate dielectric layer 601 that is under the dual gate structure. For example, using first gate structure 504 and second gate structure 506 as masking layers, a dry plasma etching process or a wet chemical etching process can be used to remove exposed portions of gate dielectric material 401. In some embodiments, portions of gate dielectric material 401 that is between first gate structure 504 and second gate structure 506 can be protected using masking elements (e.g., photoresist) and remains intact after the one or more etching processes, as shown in FIG. 6. Alternatively, portions of gate dielectric material 401 formed between first gate structure 504 and second gate structure 506 are exposed and can be removed during the etching processes, as shown in FIG. 7.

Dielectric material can be deposited to form inner spacers 602 and outer spacers 604. Inner spacers 602 can be formed on gate dielectric material 401 and between first gate structure 504 and second gate structure 506. Outer spacers 604 can be formed on outer sidewalls of first and second gate structures 504 and 506. Outer spacers 604 can also be formed in direct contact with channel region 204 and drift region 206. FIG. 6 illustrates the configuration in which gate dielectric material 401 remains between first and second gate structures 504 and 506. In such configuration, the formation of inner spacers 602 can include depositing dielectric material on inner sidewalk of first gate structure 504 and second gate structure 506 as well as on a portion of the top surface of gate dielectric material 401 between the aforementioned gate structures. FIG. 7 illustrates the configuration in which gate dielectric material 401 is removed from between first and second gate structures 504 and 506. In such configuration, the formation of inner spacers 602 can include depositing dielectric material on inner sidewalls of first gate structure 504 and second gate structure 506 as well as the top surface of drift region 206. In both configurations illustrated in FIGS. 6 and 7, inner spacers 602 can have a non-planar top surface. For example, a top surface of inner spacers 602 can have a concave top surface, as illustrated in FIGS. 6 and 7. In some embodiments, top surface of inner spacers 602 can be substantially planar (not illustrated in FIG. 6 or 7).

Inner spacers 602 and outer spacers 604 can be formed using a deposition process followed by one or more etching or planarization processes. For example, a blanket layer of dielectric material can be deposited on exposed surfaces of channel region 204, drift region 206, as well as sidewall and top surfaces of first and second gate structures 504 and 604. Dielectric material fills in the gap between first and second gate structures 504 and 506 such that inner spacers 602 are formed. In some embodiments, the blanket layer of dielectric material can be deposited using ALD, CVD, PVD, sputtering, e-beam evaporation, spin-on application, any suitable deposition methods, and/or combinations thereof. One or more etching processes can remove portions of the blanket layer of dielectric material from top surfaces of channel region 204 and drift region 206 such that outer spacers 604 are formed. In some embodiments, inner spacers 602 and outer spacers 604 can include silicon oxide, silicon nitride, silicon oxynitride, silicon carbide, silicon oxycarbide, any suitable dielectric material, and/or combinations thereof in some embodiments, inner spacers 602 and outer spacers 604 can be formed using any suitable low-k dielectric material (e.g., a material having dielectric constant lower than about 3.9). A planarization process can be applied after the formation of inner spacers 602 and outer spacers 604. For example, a chemical mechanical polishing (CMP) process can be applied such that top surfaces of first gate structure 504 and second gate structure 506 are exposed.

Figure 8:
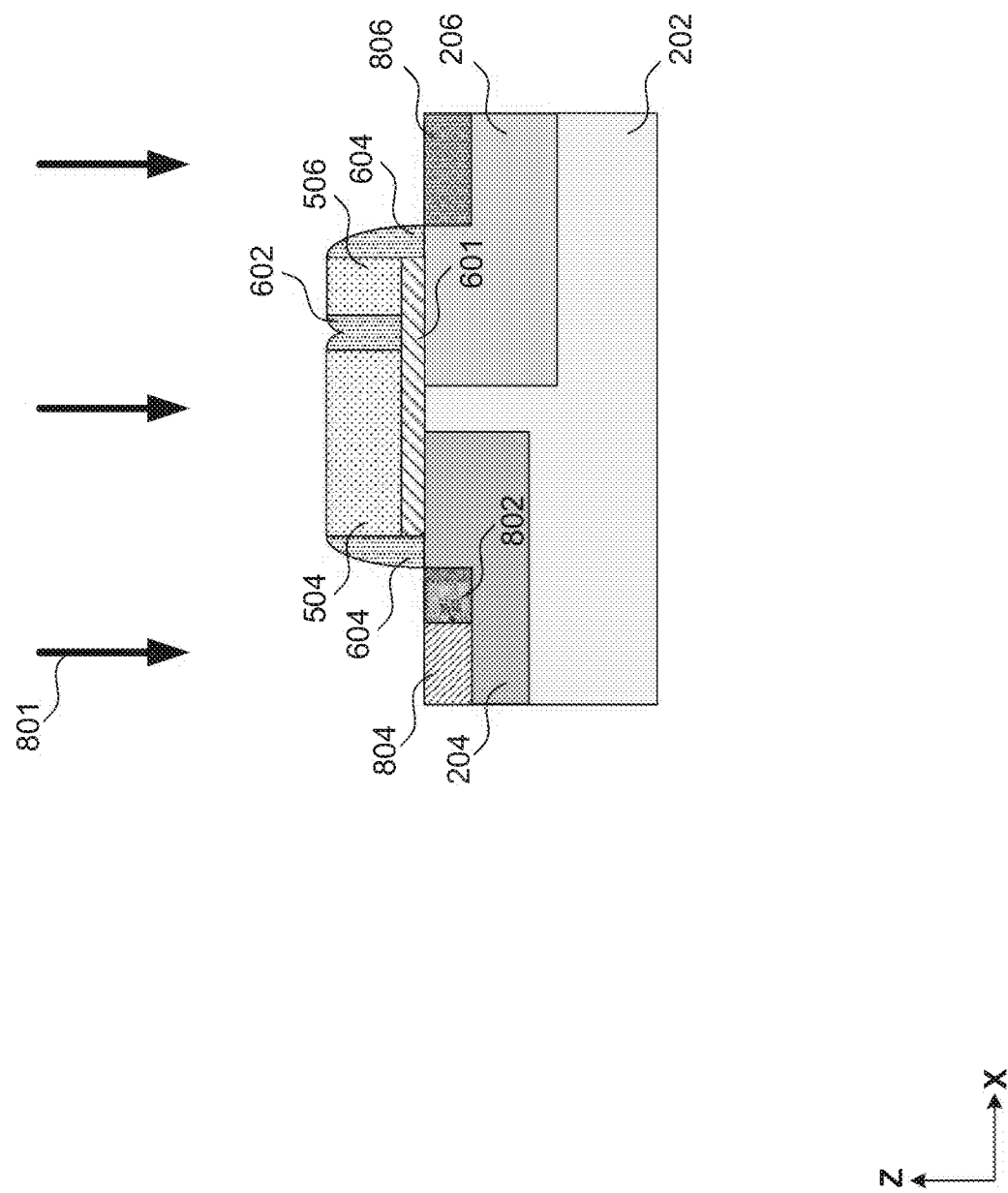

Referring to FIG. 2, in operation 250, self-aligned source and drain regions are formed, according to some embodiments. As shown in FIG. 8, source region 802 and drain region 806 can be formed in channel region 204 and drift region 206, respectively. In some embodiments, a bulk region 804 can also be formed in channel region 204 and abutting source region 802. In some embodiments, bulk region 804 can be an intrinsic material or doped with p-type or n-type dopants. Source region 802 and drain region 806 can be formed using a self-aligned ion implantation process. For example, an ion implantation process 801 can be implemented to inject n-type or p-type ions into exposed surfaces of channel region 204 and drift region 206 of the semiconductor structure illustrated in FIG. 6. Ion implantation process 801 can also be applied to the semiconductor structure illustrated m FIG. 7. The source and drain regions are self-aligned because first and second gate structures 504 and 506, inner spacers 602, and outer spacers 604 provide as physical barriers between underlying structures and the ion bombardment during the ion implantation process, resulting in the source and drain regions abutting outer spacers 604. For example, source region 802 can be formed abutting outer spacer 604 and in areas of channel region 204 not protected by outer spacer 604. Similarly, drain region 806 can be formed abutting the opposite outer spacer 604 and in areas of drift region 206 not protected by the opposite outer spacer 604. In some embodiments, source region 802 can be doped using a different dopant type than channel region 204. In some embodiments, dopant concentration of source region 802 can be different from that of channel region 204. In some embodiments, drain region 806 can be doped with a similar type dopant as of drift region 206. In some embodiments, a dopant concentration of drain region 806 can be greater than a dopant concentration of drift region 206. In some embodiments, drift region 206 can have a dopant concentration between about $1\times10^{15}$ cm$^{-3}$ and about $1\times10^{17}$ cm$^{-3}$.

Figure 9:
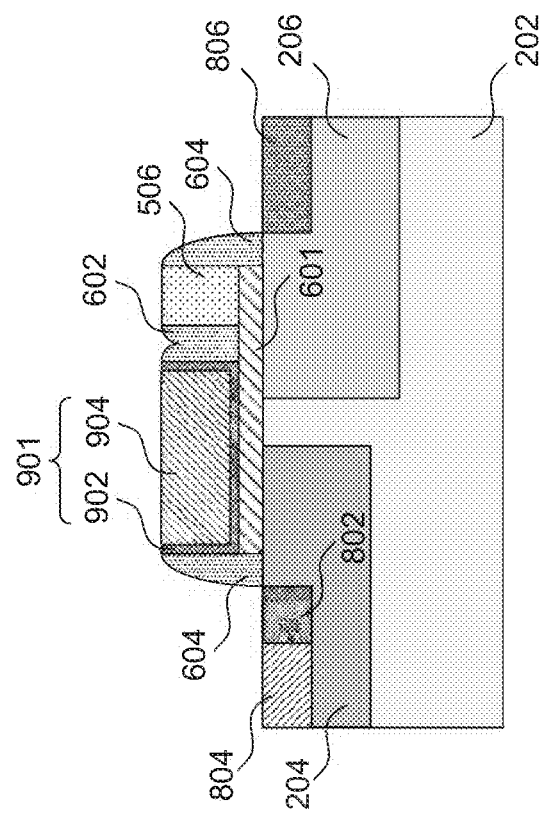
Figure 10:
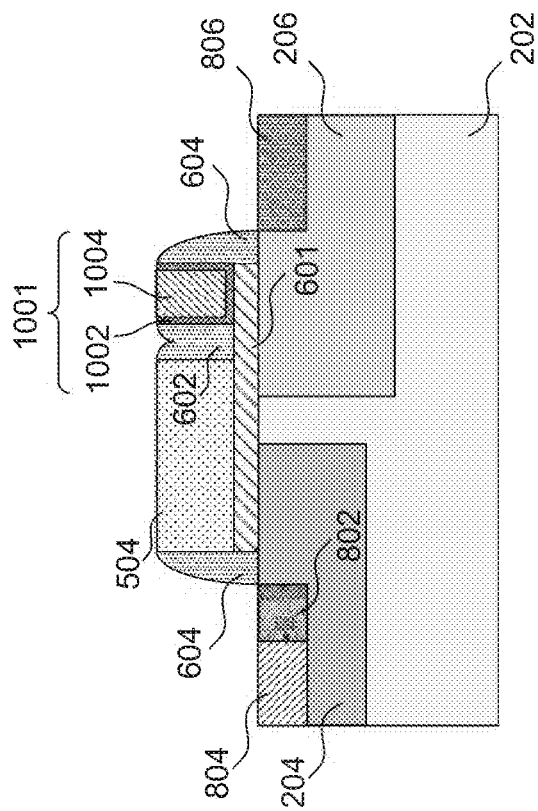
Figure 11:
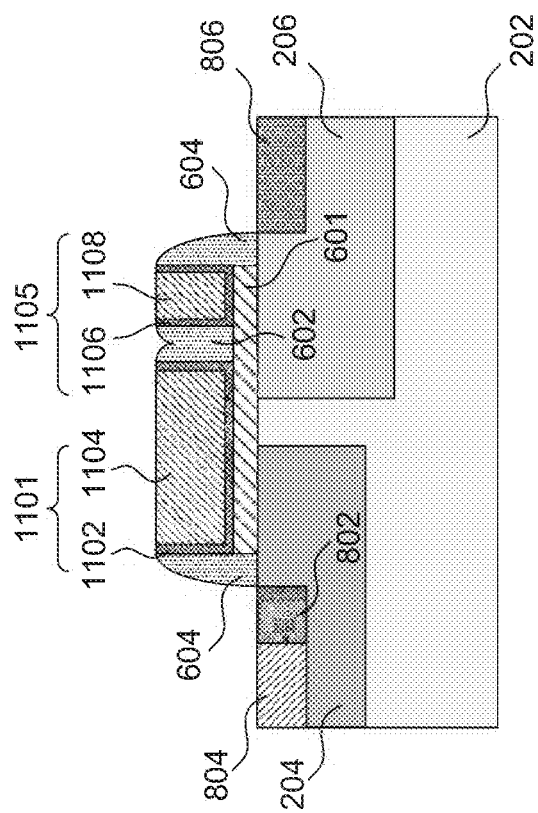

Referring to FIG. 2, in operation 260, an optional gate replacement process is performed on the first gate structure and/or the second gate structure, according to some embodiments. The optional gate replacement process can be applied to replace the first gate structure, the second gate structure, or both, with a metal gate structure. FIG. 9 illustrates a first gate structure formed using a stack of metal layers and a second gate structure formed using silicon material. FIG. 10 illustrates a first gate structure formed using a silicon material and a second gate structure formed using a stack of metal layers. FIG. 11 illustrates each of the first and second gate structures formed using a stack of metal layers.

As shown in FIG. 9, a gate replacement process can be implemented to replace first gate structure 504 with a metal gate stack 901. In some embodiments, the gate replacement process can begin with removing first gate structure 504 using suitable etching processes. For example, a plasma etching process can be used to remove first gate structure 504 formed using silicon. The plasma etching process can be performed in a chemical etching chamber and using precursors, such as sulfur hexafluoride, carbon tetrafluoride, oxygen, any suitable precursors, and combinations thereof. Metal gate stack 901 can be formed in place of first gate structure 504. In some embodiments, metal gate stack 901 can include layers 902 and metal gate electrode 904. Layers 902 can include a single layer or a multi-layer structure, such as various combinations of a metal layer with a selected work function, a liner layer, a wetting layer, an adhesion layer, a metal alloy, metal silicide, and any suitable layers. In some embodiments, layers 902 can be formed using suitable materials, such as titanium silver, aluminum, titanium aluminum nitride, tantalum carbide, tantalum carbide nitride, tantalum silicon nitride, zinc, ruthenium, molybdenum, tungsten nitride, copper, tungsten, cobalt, nickel, any suitable materials, and combinations thereof. In some embodiments, layers 902 can include a suitable metal material for n-type devices or another suitable metal material for p-type devices. In some embodiments, barrier layers, liner layers, and other suitable layers can be formed between gate electrode 904 and gate dielectric layer 601 and are not illustrated in FIGS. 9-11 for simplicity. Metal gate electrode 904 can be deposited on layers 902. In some embodiments, metal gate electrode 904 can include suitable metal or metal alloys, such as tungsten, cobalt, aluminum, ruthenium, copper, silver, any suitable metal material, and combinations thereof. A planarization process (e.g., a CMP process) can be performed to remove excess conductive material of metal gate electrode 904 to planarize the top surfaces of outer spacers 604, second gate structure 506, layers 902, and metal gate electrode 904. In some embodiments, top surface of inner spacers 602 can remain concave after the planarization process. In some embodiments, top surface of inner spacers 602 can also be substantially co-planar with top surfaces of metal gate electrode 904 and second gate structure 506.

As shown in FIG. 10, a gate replacement process can be implemented to replace second gate structure 506 with a metal gate stack 1001. Similar to metal gate stack 901 described in FIG. 9, metal gate stack 1001 can include layers 1002 and metal gate electrode 1004. Layers 1002 can be similar to layers 902. For example, layers 902 can include metal work function layers. In some embodiments, metal gate electrode 1004 can be similar to metal gate electrode 904 and are not described here in detail for simplicity. In some embodiments, a planarization process can be applied such that top surfaces of first gate structure 504 and metal gate stack 1001 can be substantially co-planar.

As shown in FIG. 11, a gate replacement process can be implemented to replace both first gate structure 504 and second gate structure 506 with metal gate stack 1101 and 1105, respectively. Similar to metal gate stack 901 described in FIG. 9, metal gate stack 1101 can include layers 1102 and metal gate electrode 1104 that can be similar to layers 902 and metal gate electrode 904, respectively. Similarly, metal gate stack 1105 can be similar to metal gate stack 1001 described in FIG. 10. For example, layers 1106 and metal gate electrode 1108 can be similar to layers 1002 and metal gate electrode 1004, respectively. In some embodiments, a planarization process can be applied such that top surfaces of metal stacks 1101 and 1105 can be substantially co-planar.

Figure 12:
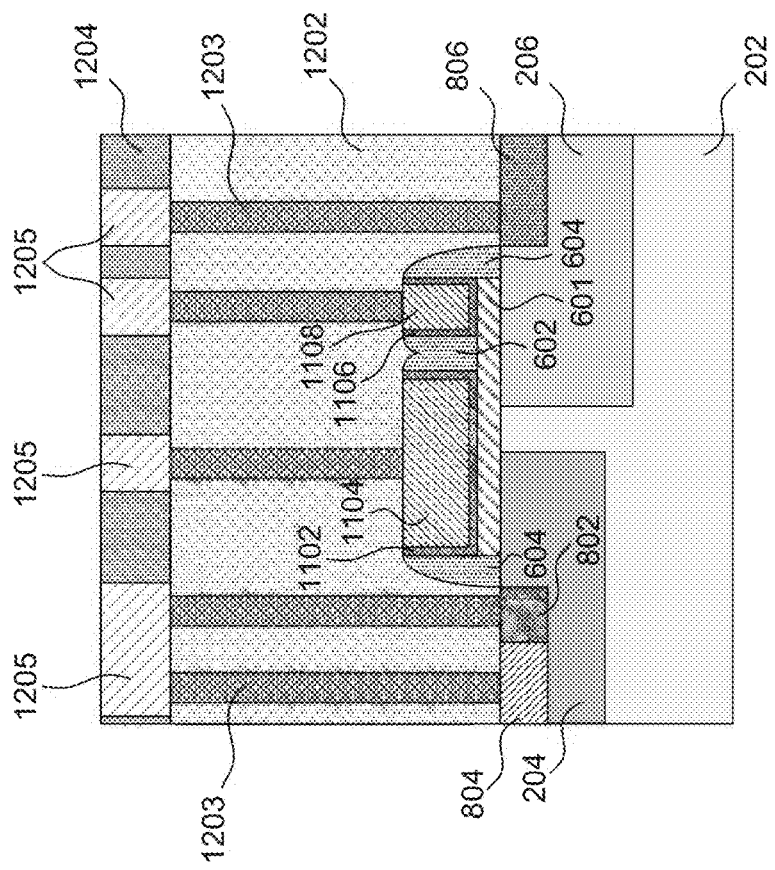

Referring to FIG. 2, in operation 270, interconnect structures are formed, according to some embodiments. As shown in FIG. 12, interconnect structures including vias 1203 and conductive wires 1205 are deposited in dielectric layers 1202 and 1204, respectively. Vias 1203 and conductive wires 1205 can be components of back-end-of-line (BEOL) structures. Dielectric layers 1202 and 1204 can be interlayer dielectric (ILD) layers formed above transistor devices. In some embodiments, dielectric layers 1202 and 1204 can be formed using silicon oxide and deposited using CVD, PVD, sputtering, any suitable deposition processes, and/or combinations thereof. In some embodiments, dielectric layers 1202 and 1204 can be formed using any suitable low-k dielectric material. Vias 1203 can be used to establish electrical connections to various terminals of the underlying semiconductor transistors. For example, vias 1203 can be electrically connected to first metal gate electrode 1104, second metal gate electrode 1108, source region 802, bulk region 804, and drift region 806. Conductive wires 1205 can provide electrical connection between vias 1203. In some embodiments, vias 1203 and 1205 can be formed using conductive materials, such as copper, cobalt, aluminum, tungsten, ruthenium, any suitable conductive material, and combinations thereof. In some embodiments, vias 1203 and conductive wires 1205 can be formed using a damascene or dual damascene process.

FIGS. 13-16 illustrate dual gate structures incorporating airgap structures, according to some embodiments. One or more airgaps can be formed between first and second gate structures of the dual gate structure to reduce parasitic capacitance. Similar elements in FIGS. 13-16 and FIGS. 3-12 can be formed using similar composition and deposition processes and are labelled with the same numerical labels for simplicity. Airgaps can filled with one or more types of inert gas. In some embodiments, airgaps can be filled with oxygen, nitrogen, any suitable types of gases, and/or combinations thereof. Therefore, airgaps have a dielectric constant about 1 which is lower than a variety of dielectric materials, such as silicon oxide and silicon nitride. Incorporating airgaps in dielectric inner spacers in a dual gate structure configuration can provide an inner spacer having an average dielectric constant that is lower than inner spacers formed using only dielectric materials.

Figure 13:
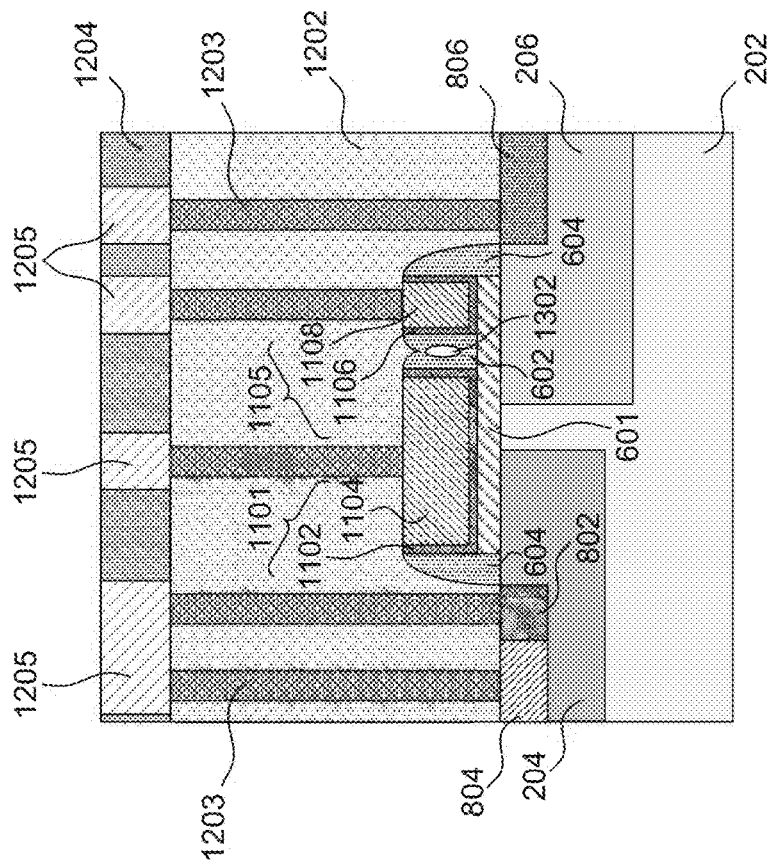

As shown in FIG. 13, an airgap is formed between first and second metal gate structures, according to some embodiments. Airgaps 1302 can be formed between first metal gate structure 1101 and second metal gate structure 1105. As described in FIG. 11, first metal gate structure can include layers 1102 and metal gate electrode 1104, and second metal gate structure can include layers 1106 and metal gate electrode 1108. Airgaps 1302 can be formed within inner spacers 602 and can include any suitable types of gases. Airgaps 1302 can be formed during the deposition of dielectric material that forms inner spacers 602 and outer spacers 604, such as the deposition process described in FIG. 6. For example, a PVD process can be used to deposit a blanket dielectric material in the opening between the first and second gate structures. During the deposition process, the blanket dielectric material can converge at the top of the openings therefore enclosing a pocket of air within the dielectric material that forms inner spacers 602.

Figure 14:
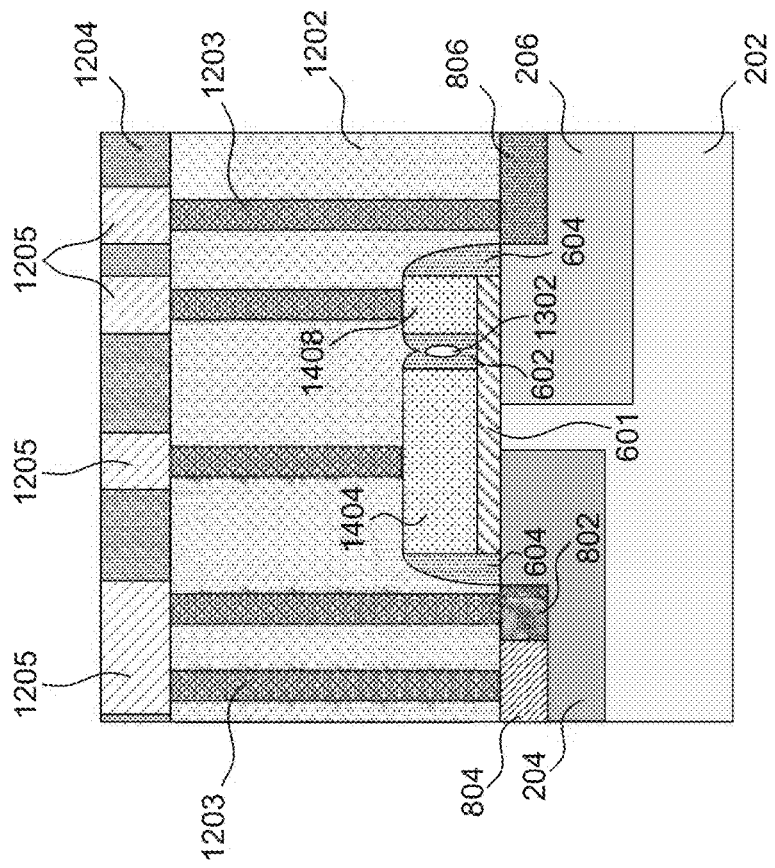

FIG. 14 illustrates a transistor device having dual silicon gate structures and one or more airgaps, according to some embodiments. First and second gate structures 1404 and 1408 can be formed using silicon material, such as polysilicon, amorphous silicon, and crystalline silicon. In some embodiments, first and second gate structures 1404 and 1408 can be similar to first and second gate structures 504 and 506 described in FIG. 5 and are not described in detail herein for simplicity.

Figure 15:
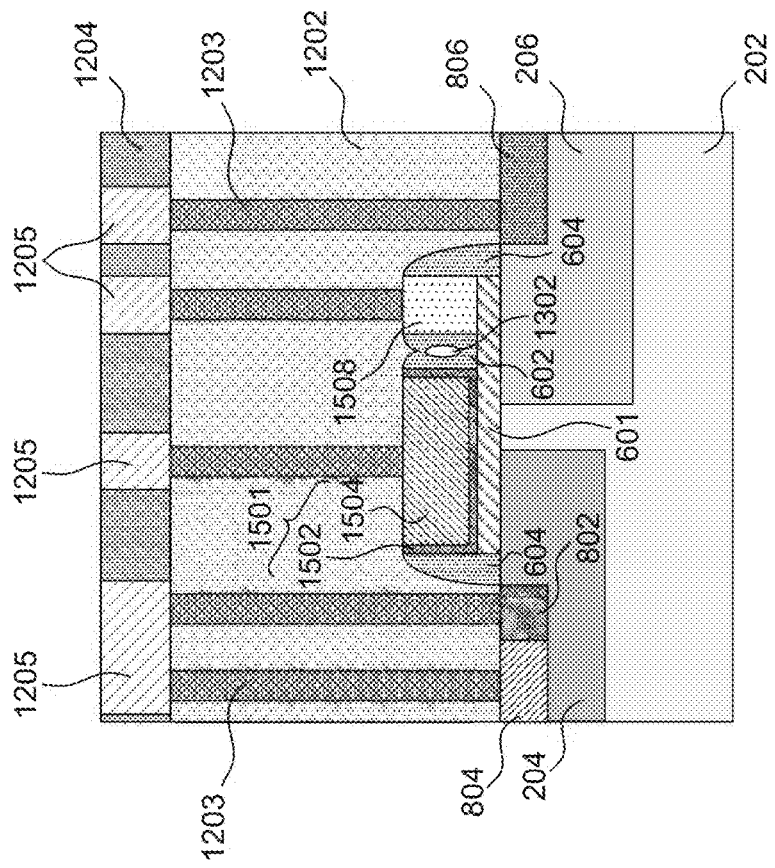

FIG. 15 illustrates a transistor device having a dual gate structure including first and second gate structures, according to some embodiments. The dual gate structure can include a metal gate structure formed over a channel region and a silicon gate structure formed over a drift region, according to some embodiments. As shown in FIG. 15, the first gate structure can be a metal gate structure 1501 including layers 1502 and metal gate electrode 1504 that are formed over channel region 204. The second gate structure can be a silicon gate structure 1508 formed over drift region 206. Metal gate structure 1501 and silicon gate structure 1508 can be similar to first gate structure 1101 in FIG. 11 and second gate structure 506 in FIG. 5, respectively, and are not described in detail herein for simplicity. One or more airgaps 1302 can be formed between metal gate structure 1501 and silicon gate structure 1504.

Figure 16:
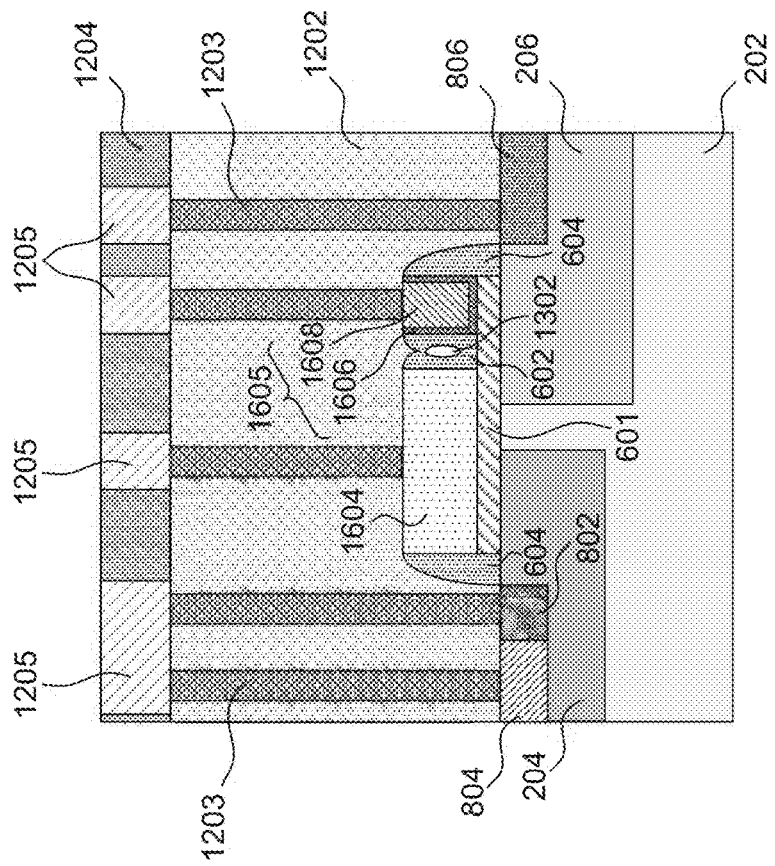

FIG. 16 illustrates a transistor device having a dual gate structure including first and second gate structures, according to some embodiments. The dual gate structure can include a silicon gate structure formed over a channel region and a metal gate structure formed over a drift region, according to some embodiments. As shown in FIG. 16, the first gate structure can be a silicon gate structure 1604 formed over portions of channel region 204 and portions of drift region 206. Silicon gate structure 1604 can be similar to first gate structure 504 described in FIG. 5. The second gate structure can be a metal gate structure 1605 including layers 1606 and metal gate electrode 1608. Metal gate structure 1605 can be similar to metal gate structure 1105 described in FIG. 11. One or more airgaps 1302 can be formed between silicon gate structure 1604 and metal gate structure 1605.

Various embodiments in the present disclosure describe methods for forming semiconductor transistor devices with dual gate structures formed between source/drain regions. A first gate structure can be formed above a channel region for controlling the ON/OFF status of the transistor device. The first gate structure can also be formed above a portion of a drift region that is located between the channel region and the drain region. A second gate structure can be formed above a drift region. The second gate structure can be electrically decoupled from the first gate structure. One or more airgap structures can be formed between the first and second gate structures to further reduce parasitic capacitance and improve device performance.

In some embodiments, a semiconductor structure includes a channel region, a source region adjacent to the channel region, a drain region, a drift region adjacent to the drain region, and a dual gate structure. The dual gate structure includes a first gate structure over portions of the channel region and portions of the drift region. The dual gate structure also includes a second gate structure over the drift region.

In some embodiments, a transistor device includes a source region, a drain region, a channel region between the source region and the drain region, and a drift region between the drain region and the channel region. The transistor device also includes a gate dielectric layer in contact with the channel region and the drift region. The transistor device also includes a dual gate structure over the gate dielectric layer. The dual gate structure includes a first gate structure over the channel and drift regions, wherein the first gate structure has a first gate length. The dual gate structure also includes a second gate structure over the drift region, wherein the second gate structure has a second gate length.

In some embodiments, a method for forming a semiconductor structure includes forming a channel region and a drift region in a substrate. The method also includes depositing a gate dielectric layer on top surfaces of the channel region, the drift region, and the substrate. The method further includes depositing a gate material on the gate dielectric layer and etching the gate material to form a dual gate structure. The dual gate structure includes a first gate structure over the channel and drift regions. The first gate structure has a first gate length, The dual gate structure also includes a second gate structure over the drift region. The second gate structure has a second gate length. The method also includes etching the gate dielectric layer and forming outer spacers on outer sidewalls of the dual gate structure. The method further includes forming an inner spacer in contact with the first and second spacers.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a channel region disposed in the substrate;
   a source region adjacent to the channel region;
   a drain region disposed in the substrate;
   a drift region adjacent to the drain region;
   a dual gate structure, comprising:
      a continuous gate dielectric layer disposed directly on the channel region and the drift region;
      a first gate stack disposed on the gate dielectric and overlapping with the channel region and the drift region; and
      a second gate stack disposed on the gate dielectric, non-overlapping with the channel region, and overlapping with the drift region;
   an inner spacer disposed between the first and second gate stacks and in physical contact with the continuous gate dielectric layer:
   a first outer spacer disposed along a sidewall of the first gate stack and in physical contact with the channel region; and
   a second outer spacer disposed along a sidewall of the second gate stack and in physical contact with the drift region.

2. The semiconductor structure of claim 1, wherein the inner spacer is in contact with the first and second gate stacks.

3. The semiconductor structure of claim 1, wherein the inner spacer comprises an airgap.

4. The semiconductor structure of claim 1, wherein the inner spacer comprises a non-planar top surface.

5. The semiconductor structure of claim 1, wherein the continuous gate dielectric layer is in contact with the first and second gate stacks.

6. The semiconductor structure of claim 1, wherein a bottom surface of the inner spacer is in contact with a top surface of the continuous gate dielectric layer and coplanar with bottom surfaces of the first and second gate stacks.

7. The semiconductor structure of claim 1, wherein:
   the first outer spacer is disposed along a first sidewall of the continuous gate dielectric layer; and
   the second outer spacer is disposed along a second sidewall of the continuous gate dielectric layer.

8. The semiconductor structure of claim 7, wherein the source region is non-overlapping with the first outer spacer and the drain region is non-overlapping with the second outer spacer.

9. The semiconductor structure of claim 1, wherein the first and second gate stacks comprise first and second gate lengths, respectively, and a ratio of the second gate length over the first gate length is between about 0.1 and about 0.6.

10. The semiconductor structure of claim 1, further comprising a wherein the continuous gate dielectric layer is in contact with the first outer spacer and the second outer spacer.

11. A transistor device, comprising:
a source region;
a drain region;
a channel region disposed between the source region and the drain region;
a drift region disposed between the drain region and the channel region;
a continuous gate dielectric layer in contact with the channel region and the drift region;
a dual gate stack disposed on the continuous gate dielectric layer, the dual gate stack comprising:
   a first gate stack disposed on the channel and drift regions, wherein the first gate stack comprises a first gate length; and
   a second gate stack disposed on the drift region, wherein the second gate stack comprises a second gate length;
an inner spacer disposed between the first and second gate stacks and in physical contact with the continuous gate dielectric layer, wherein a bottom surface of the inner spacer is coplanar with bottom surfaces of the first and second gate stacks;
a first outer spacer disposed on and in physical contact with the channel region; and
a second outer spacer disposed on and in physical contact with the drift region.

12. The transistor device of claim 11, wherein the first gate length is greater than the second gate length.

13. The transistor device of claim 11, wherein a ratio of the second gate length over the first gate length is between about 0.1 and about 0.6.

14. The transistor device of claim 11, the inner spacer is in contact with sidewalls of the first and second gate stacks.

15. The transistor device of claim 14, wherein the inner spacer comprises an airgap.

16. A semiconductor device, comprising:
a substrate;
first and second doped regions disposed in the substrate;
a continuous gate dielectric layer disposed on the first and second doped regions;
first and second metal gate stacks disposed on the continuous gate dielectric layer, wherein the first metal gate stack overlaps the first and second doped regions;
a source region disposed adjacent to the first doped region and non-overlapping with the first metal gate stack;
a drain region disposed adjacent to the second doped region and non-overlapping with the second metal gate stack;
an inner spacer disposed between the first and second metal gate stacks and in physical contact with the continuous gate dielectric layer, wherein a bottom surface of the inner spacer is coplanar with bottom surfaces of the first and second metal gate stacks;
a first outer spacer disposed along a sidewall of the first metal gate stack and in physical contact with the first doped region; and
a second outer spacer disposed along a sidewall of the second metal gate stack and in physical contact with the second doped region.

17. The semiconductor device of claim 16, wherein the inner spacer is in contact with the first and second metal gate stacks.

18. The semiconductor device of claim 16, wherein a gate length of the first metal gate stack is greater than a gate length of the second metal gate stack.

19. The semiconductor device of claim 16, wherein the first and second metal gate stacks comprise metal layers in contact with the continuous gate dielectric layer.

20. The semiconductor device of claim 16, wherein:
the first outer spacer is disposed along a first sidewall of the continuous gate dielectric layer; and
the second outer spacer is disposed along a second sidewall of the continuous gate dielectric layer.

* * * * *

UNITED STATES PATENT AND TRADEMARK OFFICE
CERTIFICATE OF CORRECTION

PATENT NO. : 12,132,108 B2  
APPLICATION NO. : 17/876795  
DATED : October 29, 2024  
INVENTOR(S) : Su et al.

Page 1 of 1

It is certified that error appears in the above-identified patent and that said Letters Patent is hereby corrected as shown below:

In the Specification

In Column 8, Line 13, delete "m" and insert -- in --, therefor.

In Column 11, Line 58, delete "length," and insert -- length. --, therefor.

In the Claims

In Column 12, Claim 1, Line 30, delete "layer:" and insert -- layer; --, therefor.

In Column 12, Claim 10, Line 64, after "claim 1," delete "further comprising a".

Signed and Sealed this
Twenty-fifth Day of February, 2025

Coke Morgan Stewart
*Acting Director of the United States Patent and Trademark Office*